United States Patent [19]
Horiuchi et al.

[11] Patent Number: 6,093,476
[45] Date of Patent: Jul. 25, 2000

[54] WIRING SUBSTRATE HAVING VIAS

[75] Inventors: Michio Horiuchi; Yukiharu Takeuchi, both of Nagano, Japan

[73] Assignee: Shinko Electric Industries Co., Ltd., Nagano, Japan

[21] Appl. No.: 09/071,875

[22] Filed: May 1, 1998

[30] Foreign Application Priority Data

May 2, 1997 [JP] Japan ................................ 9-114897

[51] Int. Cl.⁷ .................................................. B32B 3/06
[52] U.S. Cl. ........................ 428/209; 428/210; 428/901; 174/255; 174/262; 174/258; 439/65; 439/74
[58] Field of Search .................................. 428/209, 901, 428/210; 174/255, 262; 439/65, 74

[56] References Cited

U.S. PATENT DOCUMENTS

| | | | |
|---|---|---|---|
| 3,541,222 | 11/1970 | Parks et al. .............................. | 174/261 |
| 4,954,878 | 9/1990 | Fox et al. ................................. | 361/381 |
| 5,162,240 | 11/1992 | Saitou et al. .............................. | 427/96 |
| 5,262,226 | 11/1993 | Yoshida .................................... | 428/209 |
| 5,331,514 | 7/1994 | Kuroda .................................... | 361/760 |
| 5,354,955 | 10/1994 | Gregor et al. ........................... | 174/250 |
| 5,488,542 | 1/1996 | Ito ........................................... | 361/793 |
| 5,498,467 | 3/1996 | Moela ...................................... | 428/198 |
| 5,670,250 | 9/1997 | Sanville, Jr. et al. ................... | 428/323 |
| 5,851,681 | 12/1998 | Matsuyama et al. ................... | 428/473.5 |

FOREIGN PATENT DOCUMENTS

| | | |
|---|---|---|
| 0 309 942 A2 | 4/1989 | European Pat. Off. . |
| 3939 647 | 5/1990 | Germany . |
| 61-048952 | 10/1986 | Japan . |
| 3-272191 | 12/1991 | Japan . |
| 6-291463 | 10/1994 | Japan . |
| 2 132 411 | 4/1984 | United Kingdom . |

*Primary Examiner*—Cathy F. Lam
*Attorney, Agent, or Firm*—Pennie & Edmonds LLP

[57] ABSTRACT

A wiring substrate is provided in which a common core member is used and the cost can be reduced. Diameters of the penetrating filled vias (18) are the same and not more than 300 μm, and the penetrating filled vias (18) are formed on a core substrate (20) into a matrix-shape at regular intervals of not more than 2 mm. On the surface of the core substrate (20), a plane wiring pattern (17) is formed through an insulating layer (16). Each pad portion on the wiring pattern (17) is electrically connected with each corresponding via of the filled vias (18) by one to one through a connecting via (28) which penetrates the insulating layer (16), and some of the filled vias (18) are not connected with the wiring pattern (17).

10 Claims, 6 Drawing Sheets

WIRING SUBSTRATE HAVING VIAS

BACKGROUND OF THE INVENTION

1. Field of the Invention

The present invention relates to a wiring substrate having penetrating filled vias arranged in a matrix-shape.

2. Description of the Related Art

The inventors have previously invented a method of making a substrate having via conductors which penetrate the substrate. In the method large number of fine metallic wires made of copper are arranged in a container in parallel with the axis of the container. This container is filled with a dispersed solution in which ceramic powder such as alumina powder which is to be fired at high temperature is dispersed. After drying, ceramic powder is fired at high temperatures higher than the melting point of the fine metallic wires so that the ceramic powder fired at high temperatures can be sintered sufficiently densely. In this way, a columnar sintered body, which has been densely sintered, is obtained. This sintered columnar body is sliced perpendicularly to the axis, so that a substrate having via conductors which penetrate the substrate can be obtained.

According to the above method, the fine metallic wires are melted in the process of sintering the ceramic powder at a high temperatures. Therefore, even if the ceramic contracts in the process of sintering, the fine metallic wires are not broken, and it is possible to make a substrate having via conductors arranged densely in the substrate. Also, it has been confirmed by the inventors that the fine metallic wires are not diffused in the ceramic.

Further, the inventors have developed another method of making a substrate having via conductors which penetrate the substrate. In the method a large number of fine metallic wires made of copper are arranged in a container in parallel with the axis of the container. This container is filled with ceramic powder which is to be fired at low temperatures and the primary component of the ceramic powder is glass. The ceramic powder is fired at a temperatures lower than the melting point of the fine metallic wires. In this way, a columnar sintered body is obtained. This sintered body is sliced perpendicularly to the axis, so that a substrate having via conductors which penetrate the substrate can be obtained.

According to the above method, ceramic powder, which is to be fired at low temperatures and the primary component of which is glass, is melted in the process of sintering. Accordingly, stress is not applied to the fine metallic wires. Therefore, it is possible to make a substrate having via conductors which are not broken.

However, according to the former method, the following problems may be encountered. Since the ceramic fired at a high temperature contracts with a coefficient of contraction of about 40%, the dimensional accuracy is low. Further, since the ceramic is densely fired, the hardness of the ceramics is very high. Therefore, it is difficult to slice the sintered body. If any additive is added to the ceramics so as to lower the hardness, the mechanical strength would also be lowered.

According to the latter method, the following problems may be encountered. In the latter method, a ceramic fired at a low temperatures, the primary component of which is glass, is used. Accordingly, the fired ceramic is fragile, and the mechanical strength is low.

SUMMARY OF THE INVENTION

It is an object of the present invention to provide a wiring substrate characterized in that: the core material is commonly used, so that the manufacturing cost can be reduced; and the above problems are solved and the dimensional accuracy of the wiring substrate is high.

In order to accomplish the above object, the present invention is composed as follows.

The present invention provides a wiring substrate comprising: a core substrate; penetrating filled vias formed on the core substrate, the diameters of the penetrating filled vias being the same and not more than 300 μm, the penetrating filled vias being formed into a matrix-shape at regular intervals of not more than 2 mm; a plane pattern formed on a surface of the core substrate through an insulating layer, the plane pattern having pad portions; and connecting vias penetrating the insulating layer, the connecting vias electrically connecting each pad portion on the wiring pattern with each corresponding via of the filled vias one to one, wherein a portion of the filled vias are not connected with the wiring pattern.

When a standardized common core substrate is used, which has penetrating filled vias of the same diameter of not more than 300 μm and the penetrating filled vias are arranged at regular intervals of not more than 2 mm and formed into a matrix-shape, it is possible to reduce the manufacturing cost. The radiating property of the wiring substrate is excellent because the fine metallic wires are arranged in the core substrate.

When the filled vias not connected with the wiring pattern are connected with the grounding terminals, the occurrence of cross talk can be decreased, and the electrical characteristic can be improved.

According to the invention, the core substrate is composed of a wiring body used for manufacturing a substrate in which a large number of fine metallic wires are embedded in parallel with the axis of a columnar body which is made in such a manner that a porous fired inorganic insulating material is impregnated with organic insulating material, and the wiring body used for manufacturing a substrate is sliced in a direction perpendicular to the axis. Especially when the ceramic is fired to be porous, it is possible to obtain a core substrate, the hardness of which is not so high and it can be easily machined, that is, it can be easily sliced. The coefficient of contraction is very low. Therefore, the dimensional accuracy of the via conductor is high. In this connection, the inorganic insulating material has a skeleton structure of a continuous phase. Therefore, the mechanical strength is high.

One of the characteristics is that a ratio of the inorganic insulating material is not lower than 50 volume % and not higher than 80 volume %.

When the ratio of the inorganic insulating material is lower than 50 volume %, it is difficult to set the condition of firing, and the porosity varies. Therefore, the reproducibility is deteriorated. When the ratio of the inorganic insulating material is approximately 60%, contraction seldom occurs in the process of firing, and the dimensional accuracy is high. When the ratio of the inorganic insulating material is higher than 80%, the density is somewhat increased, and contraction is caused. Therefore, problems may be caused in the dimensional accuracy. Further, some of the blow holes in the inorganic insulating material are impregnated with resin and become discontinuous.

The inorganic insulating material is preferably made of a fired body of aluminum oxide, mullite, cordierite or aluminum nitride.

In the process of firing, necks are generated among powder. Therefore, it is possible to obtain a porous fired body in which powder is connected with each other.

Alternatively, the inorganic insulating material may be a mixed fired body in which glass, the softening point of which is not higher than 1000° C., is mixed with one or more of aluminum oxide, mullite, cordierite, silicon oxide, aluminum nitride, silicon carbide and silicon nitride.

In the process of firing, the glass component connects the ceramic powder. Therefore, contraction can be suppressed without conducting sintering.

The organic insulating material may be a resin of polyimide, benzocyclobutene, bismaleimide triazine, epoxy or polyphenylene ether.

The heat resistance of a resin of polyimide or benzocyclobutene is high.

A wiring body is used for manufacturing a substrate in which a large number of fine metallic wires are embedded in a columnar body composed of an organic insulating material of continuous phase and an inorganic insulating material of discontinuous phase, in parallel with the axis of the columnar body.

In this case, since the inorganic insulating material is dispersed in the organic insulting material, contraction seldom occurs, and the dimensional accuracy is high and the mechanical strength is high. Further, it is possible to reduce the manufacturing cost.

In this case, it is preferable that a ratio of the organic insulating material is not lower than 30 volume % and not higher than 60 volume %.

When the ratio of the organic insulating material is lower than 30 volume %, it becomes difficult to mix the inorganic insulating material with the organic insulating material. When the ratio of the organic insulating material is higher than 60 volume %, there is a possibility that the mechanical strength is deteriorated.

It is preferable that the inorganic insulating material is one or more of aluminum oxide, mullite, cordierite, silicon oxide, aluminum nitride, silicon carbide and silicon nitride. Especially when aluminum nitride is used for the inorganic insulating material, it is possible to make a wiring substrate the radiating property of which is excellent.

It is preferable that the organic insulating material is a resin of polyimide, benzocyclobutene, bismaleimide triazine, epoxy or polyphenylene ether.

DETAILED DESCRIPTION OF THE PREFERRED EMBODIMENT

Referring to the accompanying drawings, a preferred embodiment of the present invention will be explained below.

Figure 1A:
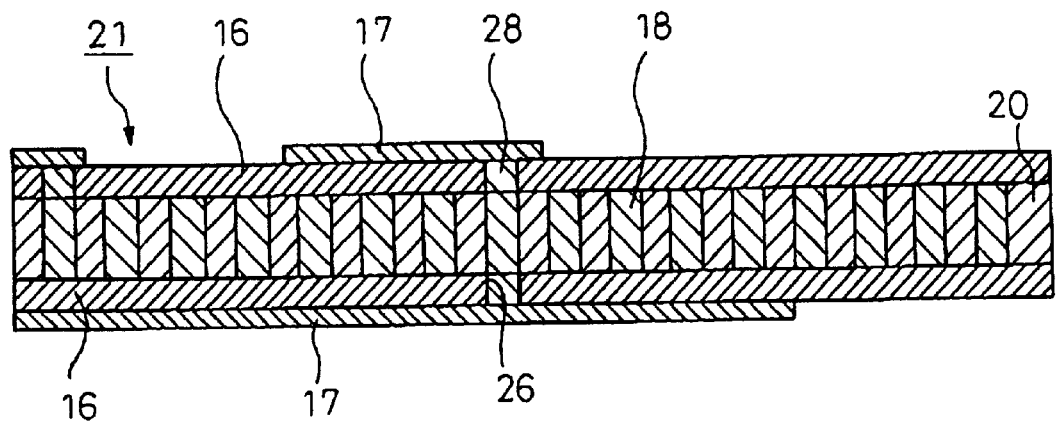
FIGS. 1(a) and (b) are cross-sectional views showing examples of the wiring substrate of this invention.

FIG. 1(a) is a cross-sectional view for explaining the wiring substrate 21 according to the present invention.

Reference numeral 20 is a core substrate manufactured by various manufacturing methods described later. Filled vias 18 composed of fine metallic wires, the diameters of which are the same and not larger than 300 $\mu$m, are arranged in the insulating material of the core substrate 20 in such a manner that the filled vias 18 penetrate the core substrate 20 in the vertical direction and are formed into a matrix-shape at regular intervals of not more than 2 mm.

In this case, it is preferable to use a standardized core substrate 20 in which the diameter of the filled via 18 is, for example, 300 $\mu$m, 200 $\mu$m, 100 $\mu$m or 50 $\mu$m, and the interval between the filled vias 18 is, for example, 2 mm, 1.5 mm, 1.27 mm, 1 mm or 0.5 mm.

In this connection, unless the diameter of the filled via 18 (fine metallic wire) is a value not less than 50 $\mu$m, there is a possibility of breaking of the wire when the columnar body is formed.

On both surfaces of the core substrate 20, there are provided insulating layers 16, 16 made of insulating material such as photosensitive resist. The insulating layers 16, 16 may be formed in such a manner that resin sheets are made to adhere onto the surfaces' of the core substrate 20 with adhesive. Alternatively, the insulating layers 16, 16 may be formed in such a manner that a varnish-like resin is coated on the surfaces of the core substrate 20.

Through-holes 26 are formed on the insulating layers 16, 16 in accordance with a predetermined pattern so that the predetermined filled vias 18 can be exposed. These through-holes 26 may be formed by the method of photolithography. Alternatively, these through-holes 26 may be formed by means of laser beams in the case where the insulating layers 16 are not a photosensitive resist.

These through-holes 26 are filled with conductive material such as conductive resin, so that the connecting vias 28 can be formed.

On the surfaces of both insulating layers 16, 16, the predetermined plane wiring patterns 17, 17 are formed so that they can be connected with the connecting vias 28. In this way, the wiring substrate 21 is formed.

The wiring patterns 17, 17 are formed as follows. Thin metallic films made of copper are formed on the insulating layers 16, 16 by means of sputtering or vapor-deposition. If necessary, plating is conducted on the thin metallic films. In this way, a thin metallic film of a predetermined thickness is formed. After that, the thin metallic film is subjected to etching. In this way, the wiring patterns 17, 17 can be formed.

Alternatively, layers of metallic foil such as electrolysis copper foil may be previously provided on the insulating layers 16, 16. Through-holes 26 are formed at the predetermined positions on the insulating layers 16, 16 having layers of metallic foil. These through-holes 26 are filled with conductive material so as to form the connecting vias 28. The thus formed insulating layers 16, 16 are made to adhere onto both surfaces of the core substrate 20. Then, the layers of metallic foil are etched, so that the predetermined wiring patterns 17, 17 can be formed. Alternatively, when the insulating layers are in the stage of sheets, the layers of metallic foil may be previously etched so as to form the wiring patterns 17, 17. After that, the insulating layers may be made to adhere onto the core substrate 20 so as to form the wiring substrate 21.

Concerning the core substrate 20 described above, the filled vias 18 are previously formed into a matrix-shape on the core substrate 20 in accordance with the standardized diameter and interval of the matrix. When the thus standardized core substrate 20 is used, the manufacturing cost can be reduced.

When the wiring patterns 17, 17 are designed, it is possible to conduct free designing by effectively using the filled vias 18 which are arranged in a matrix-shape.

Of course, there are filled vias 18 which are not used. Even when these vias 18 which are not used exist, they have no advance effect on this wiring substrate. When the filled vias 18 are densely formed, the radiating property can be improved by these vias.

In this connection, the filled vias 18 which are not used may be connected with grounding terminals (not shown) formed on the surface of the core substrate 20. In this way, the filled vias 18 can be put into use.

When a portion of the filled vias 18 are used for grounding, the grounding vias are mixedly provided between the signal lines. Therefore, the occurrence of crosstalk between the signal lines can be advantageously prevented.

In this embodiment, each signal line and the power source line provided between the wiring patterns 17, 17 are electrically connected through one corresponding filled via 18. When the standardized filled via 18 of a predetermined size is used, the via resistance can be decreased.

In the embodiment shown above, the wiring substrate 21 having only one layer is shown as an example. Of course, it is possible to provide a plurality of layers on the wiring substrate.

Figure 1B:
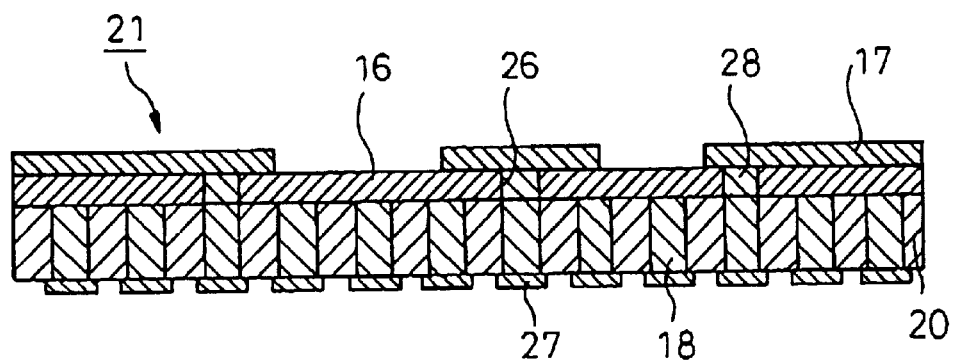

FIG. 1(*b*) is a view showing another embodiment of the wiring substrate 21. Like reference characters are used to indicate like parts in this embodiment and the embodiment explained before with reference to FIG. 1(*a*).

In this embodiment, the plane wiring pattern 17 is formed only on one side of the core substrate 20 through the insulating layer 16, and on the other side of the core substrate 20, the lands 27 electrically connected with the filled vias 18 are directly formed on the surface of the core substrate 20.

It is possible to form this wiring substrate 21 in the same manner as that described before. Alternatively, the wiring substrate 21 can be formed as follows.

First, a non-electrolytic copper plating layer is formed on one surface of the core substrate 20 obtained in the manner described later. Next, an epoxy bonding sheet is made to adhere onto the reverse side of the core substrate 20 and cured, so that an insulating layer 16 can be formed.

Holes 26, the bottom surfaces of which are the end faces of the filled vias 18, are formed at predetermined positions on the insulating layer 16 by means of laser beams of $CO_2$. Then, electrolytic copper plating is conducted in which the non-electrolytic copper plating layer is used as an electrode, so that the holes 26 are filled with copper. In this way, the connecting vias 28 can be formed.

Successively, a plane wiring pattern 17 connected with the connecting vias 28 is formed on the insulating layer 16 by the semi-additive method, and the nonelectrolytic copper plating layer on the reverse side of the core substrate 20 is etched, so that the lands 27 connected with the end surface of the filled via 18 are formed. In this way, the wiring pattern 21 can be provided.

In this connection, the insulating layer 16 may be formed by coating photosensitive epoxy resin on the core substrate 20, and holes 26 may be formed at predetermined positions on the insulating layer 16 by the photo-process in which the end surface of the filled via 18 is used as the bottom surface. The thus formed holes 26 are filled with copper. In this way, the connecting vias 28 may be formed.

Figure 2:
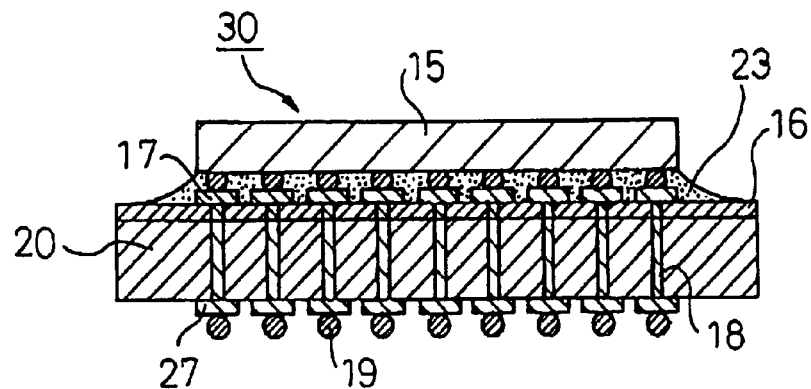
FIG. 2 is a cross-sectional view showing an example of the semiconductor device.
Figure 3:
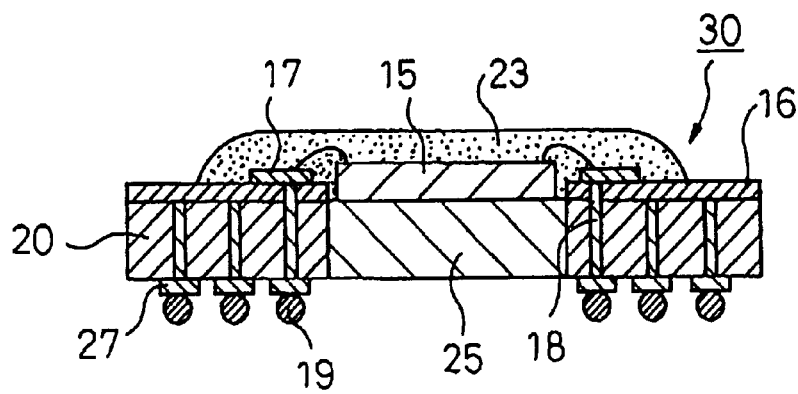
FIG. 3 is a cross-sectional view showing another example of the semiconductor device.
Figure 4:
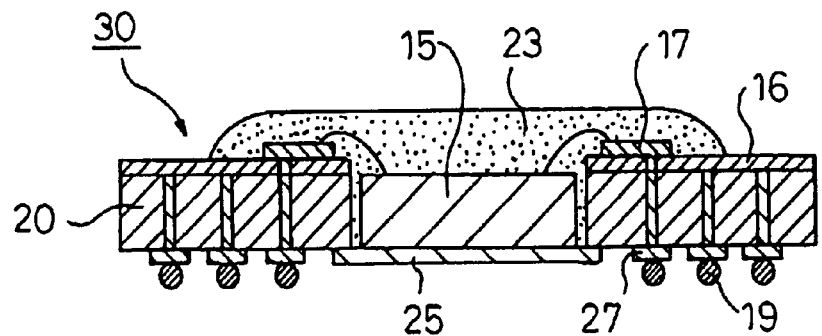
FIG. 4 is a cross-sectional view showing still another example of the semiconductor device.

FIGS. 2 to 4 are views showing examples of the semiconductor device 30 in which the above wiring substrate 21 is used.

In the example shown in FIG. 2, the semiconductor chip 15 is connected to by means of flip chip process and mounted on one wiring pattern 17 and external connecting terminals 19 composed of solder bumps are attached onto the other wiring pattern 17. In this way, the semiconductor device 30 of a BGA (ball grid array) type is formed. The filled vias 18 which are not connected with the signal line and the power source line are connected to the grounding terminals.

In this connection, reference numeral 23 is a resin used for sealing The insulating layer 16 functions as a buffer layer between the core substrate 20 and the semiconductor chip 15.

In the example shown in FIG. 3, there is shown an example in which the semiconductor chip 15 is mounted on the radiating plate 25 arranged at the center of the core substrate 20. The semiconductor chip 15 and the wiring pattern 17 are electrically communicated with each other by a wire.

Other points are the same as those shown in FIG. 2.

In the example shown in FIG. 4, the radiating plate 25 is attached onto one side of the core substrate 20 so that the through-hole formed at the center of the core substrate 20 can be covered with the radiating plate 25, and the semiconductor chip 15 is mounted on this radiating plate 25. Other points are the same as those shown in FIG. 3.

Successively, the core substrate 20 and the method of manufacturing it will be explained below.

Figure 5:
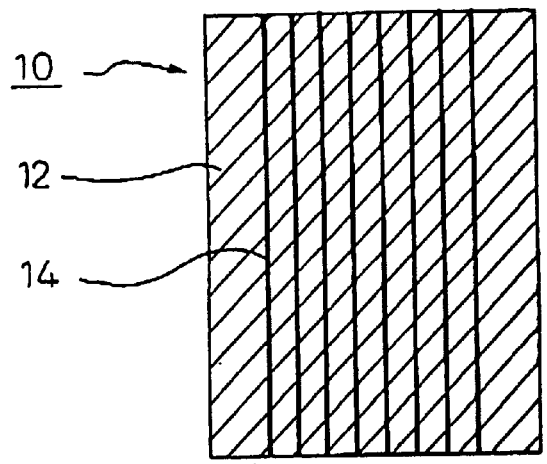
FIG. 5 is a cross-sectional view showing an outline of the first embodiment of the columnar body.

FIG. 5 is a cross-sectional view showing an outline of the columnar body 10 which is a wiring body used for manufacturing a substrate.

Reference numeral 12 is an inorganic insulating material which has been fired into a porous columnar body. Reference numeral 14 is a large number of fine metallic wires made of copper or aluminum which are embedded in the inorganic insulting material 12 in parallel with the axis.

Figure 6:
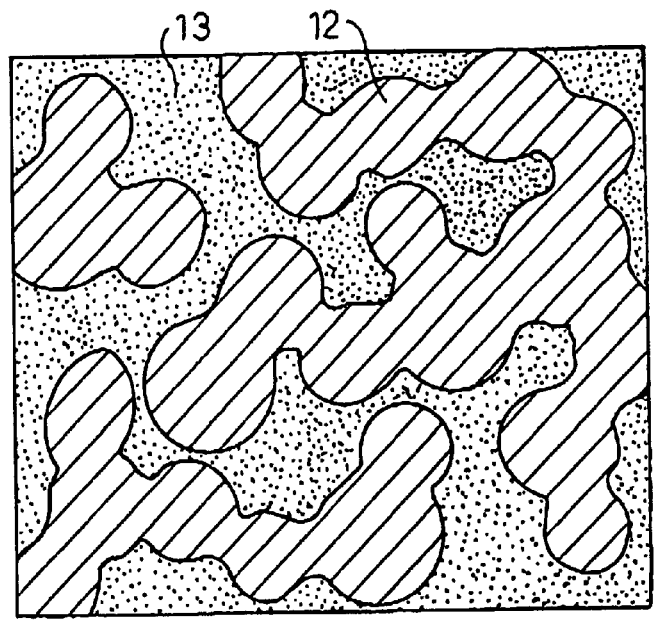
FIG. 6 is an enlarged cross-sectional view for explaining the columnar body shown in FIG. 5.

The porous inorganic insulating material 12 is impregnated with the organic insulating material 13 (shown in FIG. 6).

Figure 7:
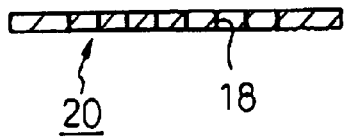
FIG. 7 is a cross-sectional view for explaining a core substrate obtained when the columnar body is sliced.

When this columnar body 10 is sliced perpendicularly to the axis and to an appropriate thickness, it is possible to obtain a core substrate (shown in FIG. 7) having the filled vias 18 in which the fine metallic wires penetrate.

The organic insulating material 13 may be a resin selected from polyimide, benzocyclobutene, bismaleimide triazine, epoxy or polyphenylene ether.

The resin of polyimide or benzocyclobutene is recommended for its heat resistance.

In order to impregnate the above resin into the inorganic insulting material 12, first, the inorganic insulating material is impregnated with a coupling agent such as a silane coupling agent in a decompressed condition so that the inorganic insulating material can be closely contacted, and then the coupling agent is replaced with the above resin which is in a varnish-like condition, and after that, the resin is cured.

It is preferable that the inorganic insulating material 12 is made by firing a ceramic powder, which is to be fired at high temperatures, of one of aluminum oxide, mullite, cordierite and aluminum nitride.

The columnar body 10, which has been made by firing the above ceramic powder fired at high temperatures, is porous as shown in the cross-sectional view of FIG. 6, and the void portions are open to the surface and formed into a continuous phase. In this connection, a portion may be a closed void portion. That is, firing is conducted so that the ceramic powder fired at high temperatures cannot be made dense.

A ratio of the volume of the inorganic insulating material to the overall volume of the columnar body 12 is preferably 50 to 80%. When the volume of the inorganic insulating material is lower than 50 volume %, it is difficult to set the firing condition, and the porosity varies. As a result, the reproducibility is deteriorated. When the volume of the inorganic insulating material is approximately 60 volume %, contraction seldom occurs in the process of firing, and it is possible to enhance the dimensional accuracy. When the volume of the inorganic insulating material becomes higher than 80 volume %, the ceramic powder is somewhat made dense, and contraction is caused. Therefore, the dimensional accuracy is deteriorated. Further, some of the blow holes (voids) may be discontinued, and it becomes impossible to impregnate a portion of the inorganic insulating material with resin.

On the other hand, when a ratio of the inorganic insulating material 12 to the organic insulating material 13 is adjusted, the coefficient of thermal expansion, the coefficient of thermal conductivity and the dielectric constant of the core substrate 20 can be advantageously controlled.

In general, the density of a ceramic fired body depends upon the firing temperature, firing time and distribution of grains in powder. The firing condition is determined so that the surfaces of ceramic grains can be liquidized and the liquidized surfaces adjacent to each other can be made to adhere to each other when neck portions are formed between them (shown in FIG. 6). In this way, the firing condition is determined so that the ceramic fired body cannot be made dense.

The principle by which the ceramic fired body is made dense is described as follows. First, the grains adjacent to each other form neck portions. When firing is continued, surface energy acts on the grains so that the surface area can be decreased. By this surface energy, the grains grow to a large size.

In this embodiment, firing is stopped before the surface energy to grow the grains is generated.

Accordingly, the firing temperature is set at a value lower than the temperature at which the ceramic powder is made dense, and further the firing time is generally shortened, and furthermore the grain size is made to be somewhat large. In this case, the grain size distribution is not so important. That is, the firing condition need not be very accurate, and manufacturing can be easily performed.

In this embodiment, while the porosity of ceramic powder is maintained high, firing is executed. Therefore, it is possible to suppress the ratio of contraction in the process of firing.

It is preferable that the ratio of contraction is maintained at a value not higher than 1%. It is easy to maintain the ratio of contraction at a value not higher than 5%.

Consequently, the dimensional accuracy of the core substrate 20, which has been cut out from the fired ceramic body, is high. Specifically, it is possible to obtain a core substrate 20 in which the dimensional accuracy of the filled vias 18 is high.

The hardness of the fired body of this embodiment is not higher than that of a fired body which has been made dense. Accordingly, slicing can be easily conducted with a cutter, and the production efficiency can be increased.

Figure 8:
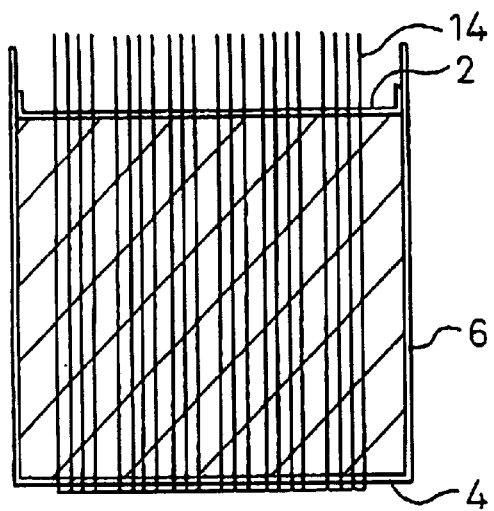
FIG. 8 is a cross-sectional view for explaining the manufacturing apparatus for making a wiring substrate of this invention.

In this embodiment, a body, which has not been fired, is made from a dispersed solution in which slurry-like or paste-like ceramic powder is dispersed. Accordingly, it is possible to use a dispersed solution in which no organic binder is used or only a small quantity of organic binder is used, in which slurry-like or paste-like ceramic powder (inorganic insulating material) is dispersed. The thus obtained dispersed solution is poured into a container 6 in which fine metallic wires 14 are stretched in parallel with each other between the upper wire guide 2 and the lower wire guide 4 as shown in FIG. 8. After that, the poured dispersed solution is dried. In this way, a ceramic powder body, which has not been fired, is provided.

Since an organic binder is not used as described above, it is unnecessary to remove the organic binder in the firing process. Accordingly, it was possible to fire a sufficiently thick body (columnar body) in a short period of time. For example, it was possible to fire a columnar body, the diameter of which was 10 cm and the height of which was 20 cm, in about 4 hours. Due to the foregoing, the productivity was greatly enhanced.

On the other hand, if an organic binder is used, it becomes necessary to remove the organic binder in the process of firing. For example, if a green sheet is used, and if it is thick, the binder cannot be sufficiently removed from a thick body. Therefore, it is possible to fire only a thin body, the thickness of which is approximately 3 cm at most.

Fine metallic wires 14 may be made of copper, gold or aluminum.

These fine metallic wires may be melted or not melted in the process of firing the inorganic insulating material 12.

Since firing is conducted under that condition that the inorganic insulating material 12 seldom contracts in the process of firing, that is, since firing is conducted under that condition that the inorganic insulating material 12 is not made dense, even if the fine metallic wires 14 are not melted, there is no possibility of breaking of the wires and deformation of the fired body caused by the contraction of the inorganic insulating material 14.

In this connection, when the fine metallic wires 14 are melted, it is possible to consider a case in which the conductive metal disappears by the vaporization or permeation of the liquidized metal into the ceramics, and also it is possible to consider a case in which the fine metallic wires 14 are short-circuited. However, concerning the vaporization of the melted metal, it is possible to take countermeasure by coating an end portion of the body, which has not been fired yet, with ceramic paste or slurry. Concerning the permeation or diffusion of the liquidized metal into the ceramic, it was confirmed by the inventors that no permeation or diffusion of the melted metal into the ceramic actually occurred.

From the viewpoint of reduction of the manufacturing cost, it is advantageous to conduct firing in the atmosphere.

According to the result of the confirmation made by the inventors, when the fine metallic wires were made of copper, copper was oxidized in the atmosphere. Therefore, it is necessary to conduct firing in a non-oxidizing atmosphere.

When the fine metallic wires 14 were made of aluminum, it was estimated that aluminum was also oxidized. However, the result of the confirmation was that aluminum was not oxidized contrary to the estimation. Formation of oxide film was recognized on the surface of the fine metallic wires of aluminum. It was considered that this oxide film of aluminum functioned as a barrier, so that the intrusion of oxygen into the center could be prevented by the oxide film of aluminum. As a result, when the fine metallic wires were made of aluminum, it was possible to conduct firing in the atmosphere at low cost, and no problems were caused in the electrical continuity.

Figure 9:
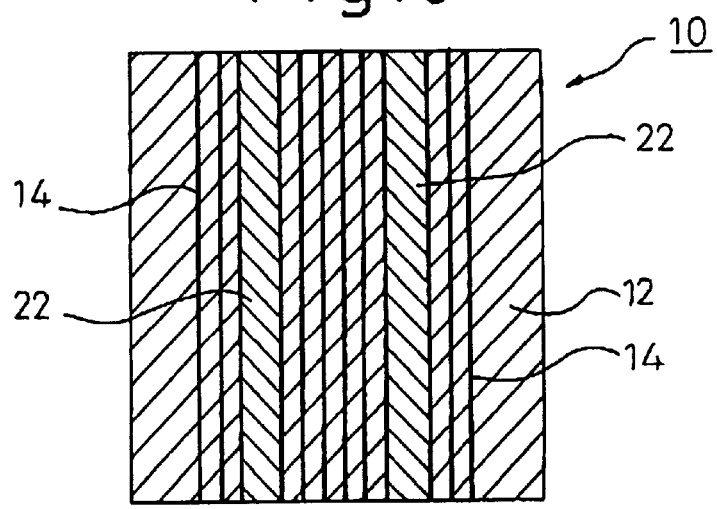
FIG. 9 is a cross-sectional view for explaining an outline of the second embodiment of the columnar body.

FIG. 9 is a view showing another embodiment of the columnar body 10.

The structure of this embodiment is the same as that of the above embodiment. In the columnar body 10 of this embodiment, there are provided fine metallic wires 14, and further there are provided rod-shaped bodies 22 in parallel with the axis of the columnar body 10, wherein the rod-shaped bodies 22 are made of a ceramic such as aluminum nitride, a metal such as copper, or a compound material composed of ceramic and metal, so that the radiating property of rod-shaped body 22 is excellent.

In order to obtain the above columnar body 10, of course, the rod-shaped body may be arranged in the container 6 shown in FIG. 8 together with the fine metallic wires 14. These circumstances are not shown in the drawing.

Figure 10:
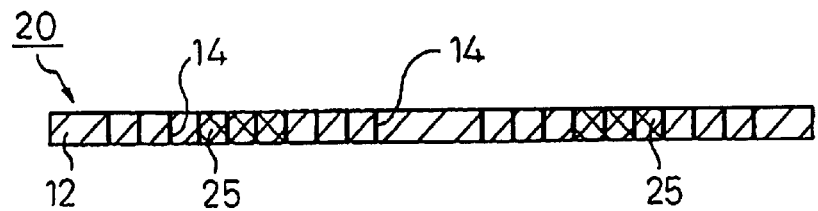
FIG. 10 is a cross-sectional view for explaining a core substrate obtained when the columnar body shown in FIG. 9 is sliced.

FIG. 10 is view showing an embodiment in which the above columnar body 10 is sliced with a cutter to an appropriate thickness so that the core substrate 20 is formed.

It is possible to mount a semiconductor chip on the radiating body 25 formed by slicing the rod-shaped body 22. Due to the foregoing, it is possible to provide a core substrate, the radiating property of which is excellent.

Figure 11:
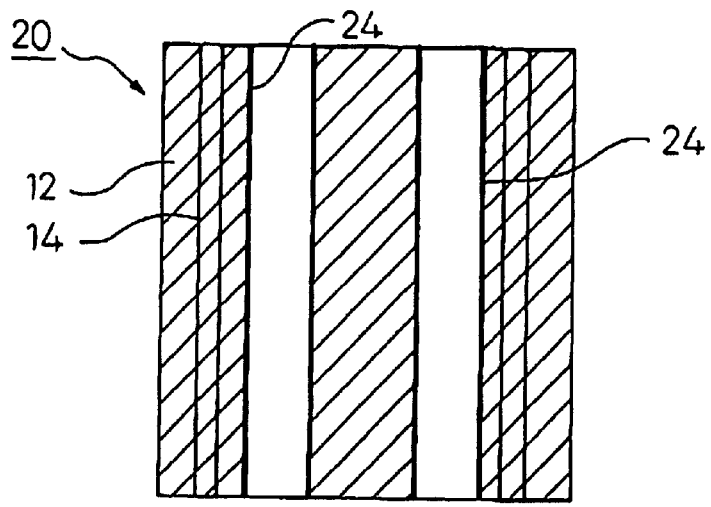
FIG. 11 is a cross-sectional view for explaining an outline of the third embodiment of the columnar body.

FIG. 11 is a view showing a still another embodiment.

The structure of this embodiment is the same as that of the above embodiment. In the columnar body 10 of this embodiment, there are provided fine metallic wires 14, and further there are provided cylindrical bodies 24 made of ceramics or metal, the section of which is square or circular.

In order to obtain the above columnar body 10, the cylindrical bodies 24 may be arranged in the container 6 together with the fine metallic wires 14 and then fired.

Figure 12:
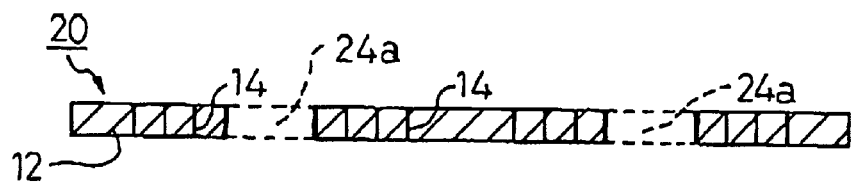
FIG. 12 is a cross-sectional view for explaining an outline of a core substrate obtained when the columnar body shown in FIG. 11 is sliced.

FIG. 12 is a view showing an embodiment in which the above columnar body 10 is sliced with a cutter to an appropriate thickness so that the core substrate 20 is formed. Due to the foregoing, it is possible to provide the core substrate 20 having through-holes 24a.

In this connection, the cylindrical bodies 24 may be left as they are. Alternatively, the cylindrical bodies 24 may be drawn out at an appropriate stage in the manufacturing process. In the case of drawing out the cylindrical bodies 24 in the manufacturing process, it is possible to form the through-holes using rod-shaped bodies.

The thus obtained core substrate 20 can be used for the semiconductor device shown in FIG. 4.

A ceramic to be fired at high temperatures is used for the inorganic insulating material in the above embodiments. Alternatively, the inorganic insulating material may be a mixed fired body in which glass, the softening point of which is not higher than 1000° C., is mixed with one or more of the ceramics, to be fired at high temperatures, of aluminum oxide, mullite, cordierite, silicon oxide, aluminum nitride, silicon carbide and silicon nitride.

In the mixed fired body described above, the glass component is melted at low temperatures, and ceramic powder is wetted by the melted glass component. Therefore, ceramic grains are made to adhere to each other. Therefore, it is possible to fire at lower temperatures.

Figure 13:
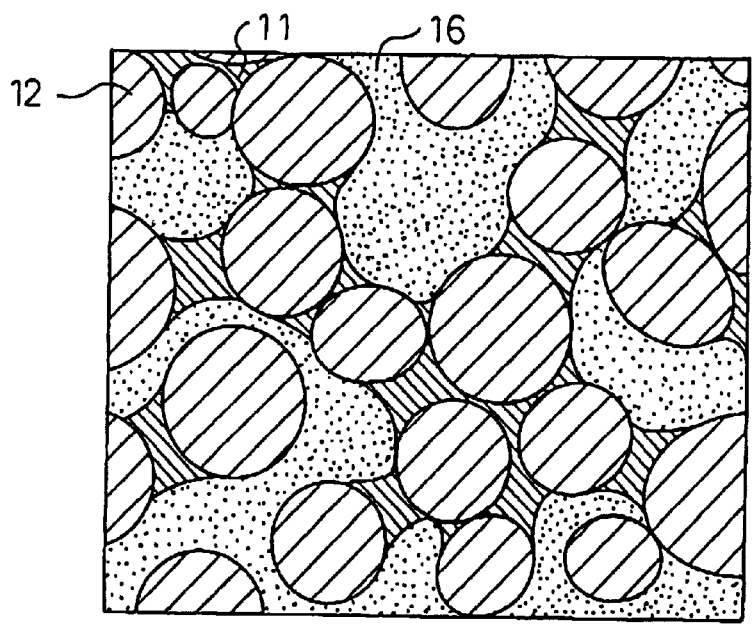
FIG. 13 is an-enlarged cross-sectional view for explaining a columnar body in the case of adding a glass component.

FIG. 13 is an enlarged cross-sectional view for explaining a columnar body or substrate of this embodiment. As can be seen in the drawing, particles of the inorganic insulating material (ceramic particles) 12 are connected with each other by the melted glass components 11. Therefore, voids are formed among the particles of the inorganic insulating material particles. The same resin 13 (organic insulating material) as that described before is impregnated into the above voids. In this way, the columnar body is completed. This columnar body is sliced, so that the same substrate as that described before can be provided.

According to this embodiment, it is possible to suppress a ratio of contraction. Therefore, it is possible to effectively manufacture a columnar body or substrate of high dimensional accuracy.

Concerning the glass component 11, as long as it can be sufficiently liquidized at the firing temperature, any composition may essentially be used. However, it is preferable to use crystalized glass, the primary component of which is borosilicate or $CaO-BaO-SiO_2$, or alternatively, it is preferable to use non-crystalized (amorphous) glass as a primary component.

In the above embodiment of the core substrate 20, the porous fired inorganic insulating material 12, the phase of which is continuous, is impregnated with the organic insulating material 13, the phase of which is continuous. Further, a columnar body 10 is obtained in which a large number of fine metallic wires 14 are embedded in parallel with the axis. The thus obtained columnar body 10 is sliced in a direction perpendicular to the axis.

In another embodiment of the core substrate 20, the organic insulating material of the continuous phase is provided, in which the inorganic insulating material made of inorganic powder is dispersed as a discontinuous phase. Further, a columnar body is obtained in which a large number of fine metallic wires are embedded in parallel with the axis. The thus obtained columnar body is sliced in a direction perpendicular to the axis.

The organic insulating material may be a resin selected from polyimide, benzocyclobutene, bismaleimide triazine, epoxy or polyphenylene ether.

The heat resistance of resin of polyimide or benzocyclobutene is high.

It is preferable that the inorganic insulating material is one or more of aluminum nitride', silicon carbide, silicon nitride, aluminum oxide, mullite, cordierite, and silicon oxide.

In order to mix the inorganic insulating material with the above organic insulating an material, an inorganic insulating material powder is dipped in a coupling agent such as a silane coupling agent, so that the coupling agent can be made to adhere onto the surface of the inorganic insulating material, and then it is mixed with the varnish-like organic insulating material.

When the coupling agent is made to adhere onto the surface of the inorganic insulating material, the inorganic insulating material and organic insulating material can be excellently mixed with each other.

Especially when a large quantity of inorganic insulating material is mixed with the organic insulating material, it is necessary to conduct a pretreatment, on the inorganic insulating material, with a coupling agent.

When the organic insulating material is cured after mixing the organic insulating material with the inorganic insulating material, the columnar body can be provided.

A preferable compounding ratio of the inorganic insulating material is not lower than 35 volume % and not higher than 60 volume %.

The higher the compounding ratio of the inorganic insulating material is, the higher the entire mechanical strength is increased. However, when the compounding ratio of the inorganic insulating material exceeds 60 volume %, a compounding ratio of the organic insulating material, which functions as a binder, is reduced. Accordingly, it becomes difficult to mix the inorganic insulating material with the organic insulating material. When the compounding ratio of the inorganic insulating material is lower than 35 volume %, the mechanical strength becomes insufficient.

In this connection, when a large quantity of inorganic insulating material is compounded, a relatively large grain size of the inorganic insulating material is advantageous, because the inorganic insulating material can be excellently mixed with the organic insulating material. When the grain size of the inorganic insulating material is large, the mechanical strength can be enhanced. A preferable grain size of the inorganic insulating material is approximately 40 μm or more.

In the same manner as that described before, the fine metallic wires may be made of copper, gold or aluminum.

In order to manufacture the above columnar body, the varnish-like organic insulating material and the inorganic insulating material are mixed with each other to prepare the material. The thus prepared material is poured into the container 6 in which the fine metallic wires 14 are stretched in parallel with each other between the upper wire guide 2 and the lower wire guide 4 as shown in FIG. 8. Thus poured material is heated, so that the organic insulating material can be cured.

Consequently, manufacturing is very easy, and a sufficiently thick columnar body can be manufactured in a short period of time. Due to the foregoing, the productivity was greatly enhanced.

The thus obtained columnar body or the substrate is seldom contracted. Therefore, the dimensions are seldom varied by the contraction of the columnar body or the substrate. It is possible to obtain a columnar body or substrate, the dimensional accuracy of which is high.

In this connection, it is preferable to stop curing the organic insulating material at stage B, that is, it is preferable to stop curing the organic insulating material in a tack dry condition. In order to complete curing at stage B, a curing agent of aromatic polyamine may be used.

When curing is stopped at stage B as described above, the substrate easily exhibits an adhesive property when it is heated. Accordingly, the thus formed substrate is preferably used for a multi-layer substrate.

EXAMPLE 1

Ethanol of 50 weight parts and surface active agent of 0.1 weight parts were added to compound material of 100 weight parts, the composition of which was powder of aluminum oxide of 50 weight % and glass of $CaO$-$BaO$-$SiO_2$ of 50 weight %, the softening point of which was approximately 850° C. Then the thus obtained mixture was mixed with a ball mill for 20 hours, and a dispersed solution was obtained.

The thus obtained dispersed solution was filled into a container made of stainless steel in which copper wires, the diameter of which was 0.3 mm, were stretched between the upper and the lower wire guide plate, and then dried.

Then, the container fired at the maximum temperature of 960° C. in dry nitrogen gas for 1 hour.

A porosity of the thus obtained fired body was approximately 34%, and a ratio of contraction was approximately 0.6%.

After this fired body had been treated in a coupling agent, it was impregnated with a mixture, in which a curing agent was compounded in epoxy of bisphenol, by the vacuum substitution method, and step treatment was conducted at the temperatures of 60, 80 and 150° C., so that it was cured.

The obtained columnar body was sliced perpendicularly to the axis, and a core substrate having vias, the thickness of which was approximately 0.7 mm, was obtained.

Next, wiring patterns of copper were formed on both sides of this core substrate by the additive method. It was confirmed that a ratio of electrical communication of each wire arranged between both sides of the substrate through the substrate was 100%.

When powder of mullite, cordierite, silicon oxide, aluminum nitride, silicon carbide or silicon nitride was singly used instead of powder of aluminum oxide or alternatively some of them were mixed with each other instead of powder of aluminum oxide, substantially the same effect was provided.

When glass of borosilicate, the softening point of which was approximately 640° C., was used instead of glass of $CaO$-$BaO$-$SiO_2$, substantially the same effect was provided.

Further, when a resin of polyimide, benzocyclobutene or bismaleimide triazine was used instead of epoxy resin of bisphenol, it was possible to provide the same excellent effect as that described above.

When fine wires of gold or aluminum were used for the fine metallic wires, the same effect was obtained.

A non-electrolytic copper plating layer was formed on one side of the thus obtained core substrate, and then a bonding sheet of epoxy was made to adhere onto a reverse side of the core substrate and then cured so as to form an insulating layer.

Holes, the bottom surfaces of which coincide with the is end surfaces of the filled vias, were formed at predetermined positions on this insulating layer by means of $CO_2$, laser beams and electrolytic copper plating was conducted using the above non-electrolytic copper plating layer as an electrode, so that the holes were filled with copper. In this way, the connecting vias were formed.

Next, a plane wiring pattern connected with the connecting vias was formed on the insulating layer by the semi-additive method, and the non-electrolytic copper plating layer on the reverse side of the core substrate was etched, so that the lands connected with the end surfaces of the filled vias were formed. In this way, a wiring substrate was made.

EXAMPLE 2

Ethanol of 50 weight parts and surface active agent of 0.1 weight parts were added to compound material of 100 weight parts, the composition of which was powder of aluminum oxide of 90 weight % and sintering assistant of the residue composed of silicon dioxide, calcium carbonate and magnesium oxide, and it was crushed and mixed with a ball mill for 48 hours. In this way, a dispersed solution was obtained.

The thus obtained dispersed solution was filled into a container made of stainless steel in which copper wires, the diameter of which was 0.3 mm, were stretched between the upper and the lower wire guide plate, and then dried.

Then, the container was fired at the maximum temperature of 1200° C. in dry nitrogen gas for 30 minutes.

A porosity of the thus obtained fired body was approximately 33%, and a ratio of contraction caused by firing was approximately 1.5%.

After this fired body had been treated in an acid and a coupling agent, it was impregnated with a resin and cured in the same manner as that of Example 1. The thus obtained body was sliced, and copper wires were formed on both sides. Then, it was confirmed that a ratio of electrical communication of each wire arranged between both sides of the substrate through the substrate was 100%.

When powder of mullite, cordierite or aluminum nitride was used instead of powder of aluminum oxide, substantially same the effect was provided.

Using the thus obtained core substrate, a wiring substrate was obtained in the same manner as that of Example 1.

EXAMPLE 3

Ethanol of 80 weight parts and surface active agent of 0.1 weight parts were added to compound material of 100 weight parts, the composition of which was powder of aluminum nitride of 50 weight parts and powder of borosilicate glass of 100 weight parts, the softening point of which was 825° C., and it was crushed and mixed with a ball mill for 20 hours. In this way, a dispersed solution was obtained.

This dispersed solution was filled into a cylindrical container made of graphite or Boron Nitride in which copper wires, the diameter of which was 0.3 mm, were stretched between the upper and the lower wire guide plate and further a rod of nylon, the diameter of which was 14 mm, was placed. The dispersed solution was dried and then the rod of nylon was drawn out.

Then, the container fawas fired at the maximum temperature of 850° C. in dry nitrogen gas for 1 hour. A porosity of the thus obtained fired body was approximately 38%, and a ratio of contraction in the radial direction was approximately 0.3%.

After this fired body had been treated in a coupling agent of silane, it was impregnated with a varnish of polyimide by the vacuum substitution method and heated and cured at the maximum temperature of 180° C.

When a varnish of benzocyclobutene, bismaleimide triazine, epoxy or polyphenylene ether was impregnated instead of a varnish of polyimide, the same good columnar body as that described before was obtained.

The thus obtained columnar body was sliced in the same manner as that of Example 1, and a core substrate having vias, on which through-hole were formed, were obtained.

Using the thus obtained core substrate, a wiring substrate was obtained in the same manner as that of Example 1.

EXAMPLE 4

Instead of the rod of nylon, the diameter of which was approximately 14 mm, a rod of aluminum nitride, the diameter of which was substantially the same, was used, and even after the completion of drying, it was put into use as it was. Except for that, other points were the same as those of Example 3, that is, a columnar body was obtained in the same composition and condition as those of Example 3.

The thus obtained columnar body was sliced. In this way, a core substrate having vias was obtained in which penetrating bodies of ceramics of aluminum nitride were formed. After polishing, a layer of titanium, the thickness of which was approximately 0.1 $\mu$m, and a layer f copper, the thickness of which was approximately 1 $\mu$m, were formed by means of magnetron spattering. After that, a layer of copper, the thickness of which was approximately 2 $\mu$m, a layer of nickel, the thickness of which was approximately 1 $\mu$m, and a layer of gold, the thickness of which was approximately 1 $\mu$m, were formed by means of electrolytic plating, and then etching was conducted so as to form a wiring pattern. It was confirmed that both surfaces were electrically communicated through the substrate, and also it was confirmed that the surface of the ceramic of aluminum nitride and the compound surface of polyimide were electrically communicated.

Using the thus obtained core substrate, a wiring substrate was obtained in the same manner as that of Example 1.

EXAMPLE 5

A powder of aluminum nitride, the average particle size of which was approximately 40 $\mu$m and the surfaces of which were cured, was subjected to surface hydrophobic treatment by a silane coupling agent. A mixture of 20 weight parts, in which DDSA (dodecanal succcinic anhydride), MNA (methylnadic anhydride) and DMP-30 (2.4.6-tris (dimethyl aminoethyl) phenol) were compounded on the base of epoxy of bisphenol, was added to and mixed with the thus obtained powder of 80 weight parts. After that, defoaming was conducted.

The thus obtained dispersed solution was filled into a cylindrical container in which copper wires, the diameter of which was 0.3 mm, were stretched between the upper and the lower wire guide plate, and then dried when it was treated stepwise at the temperatures of 60, 80 and 150° C.

The thus obtained columnar body was sliced in a direction perpendicular to the primary axis of the columnar body. In this way, a substrate having vias, the thickness of which was approximately 0.7 mm, was obtained.

Using the thus obtained core substrate, a wiring substrate was obtained in the same manner as that of Example 1.

EXAMPLE 6

A solution of methylethylketone of 25 weight parts containing a condensation type polynuclear aromatic resin of 60 weight % was added to and mixed with powder of 85 weight parts obtained when spherical powder of alumina, the average diameter of which was approximately 60 $\mu$m, was subjected to surface hydrophobic treatment by a coupling agent of silane, and then vacuum defoaming was conducted.

The thus obtained dispersed solution was filled into a cylindrical container in which copper wires, the diameter of which was 0.3 mm, were stretched between the upper and the lower wire guide plate and a column of aluminum nitride, the diameter of which was approximately 12 mm, was arranged, and then dried when it was treated stepwise at the temperatures of 100 and 230° C.

The thus obtained columnar body was sliced in a direction perpendicular to the primary axis of the columnar body. In this way, a core substrate having vias and radiating sections, the thickness of which was approximately 0.7 mm, was obtained.

When spherical powder was used as described above, powder could be filled more densely, so that the mechanical strength of the substrate could be enhanced.

Using the thus obtained core substrate, a wiring substrate was obtained in the same manner as that of Example 1.

EXAMPLE 7

A polyimide varnish of 25 weight parts was added to and mixed with powder of 80 weight parts obtained when powder of mullite, the average diameter of which was approximately 40 $\mu$m, was subjected to surface hydrophobic treatment by a coupling agent of silane, and then vacuum defoaming was conducted.

The thus obtained dispersed solution was filled into a cylindrical container in which copper wires, the diameter of which was 0.3 mm, were stretched between the upper and the lower wire guide plate and a column of silicon resin, the diameter of which was approximately 17 mm, was arranged, and then treated stepwise at the temperatures of 80 and 150° C. After that, the column of silicon resin was drawn out. After that, it was treated at the temperature of 200° C. The thus obtained columnar body was sliced in a direction perpendicular to the primary axis of the columnar body. In this way, a core substrate having vias and through-holes, the thickness of which was approximately 0.7 mm, was obtained.

Using the thus obtained core substrate, a wiring substrate was obtained in the same manner as that of Example 1.

EXAMPLE 8

Figure 14:
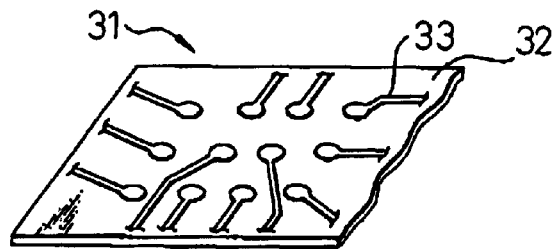
FIG. 14 is a perspective view of a polyimide film having wiring patterns used in Example 8.
Figure 15:
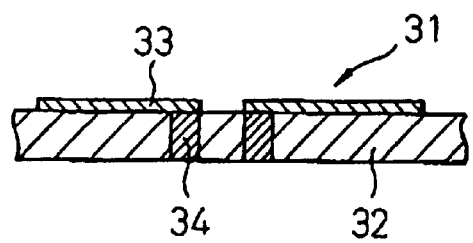
FIG. 15 is a cross-sectional view of the polyimide film shown in FIG. 14.

A thermoplastic polyimide adhesive of 35 $\mu$m thickness ("SPB" of Shin-Nittetsu Kagaku Kabushiki Kaisha) was adhered to a polyimide film of 25 $\mu$m thickness with a copper foil of 18 $\mu$m thickness ("Espanex" (Tradename) made by Shin-Nittetsu Xagaku Kabushiki Kaisha). Then, a plurality of holes each having 50 $\mu$m diameter were formed at predetermined positions by an Excimer laser in such a manner that said copper foil was exposed as respective bottoms of the holes. Then, while the surface of the copper foil was covered with a masking film, the holes were filled with copper of 55–60 $\mu$m thickness by an electric plating and subsequently filled with Sn—Pb solder by an electric plating to form connecting vias. The masking film was then removed and wiring patterns 31 of line/space of 34 $\mu$m/34 $\mu$m having land portions of 110 $\mu$m diameter for receiving the connecting vias were formed by an etching process using liquid photoresist. Thus, as shown in FIGS. 14 and 15, a wiring pattern film or substrate 31 comprising the polyimide film 32, wiring patterns 33 and connecting vias 34 was obtained.

Figure 16:
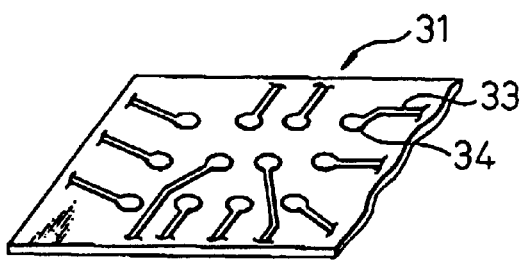
FIG. 16 is a perspective view illustrating a process of laminating the polyimide onto the core substrate.
Figure 16:
Figure 16:
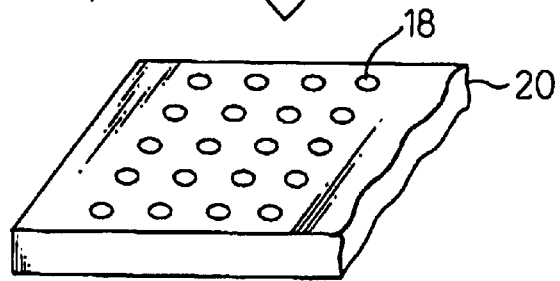

Thus obtained wiring pattern substrate 31 was then laminated in a vacuum condition onto a core substrate 20 having a plurality of filled vias 18 which was the same as that of the Example 1 as shown in FIG. 16 and unified together with heat and pressure at a temperature of 190° C. under a pressure of 30kg/cm$^2$ for 30 min. The both surfaces of thus obtained laminated substrate were coated with solder resist of photoresist and then plated with nickel and gold. Then, the laminated substrate was cut into individual packages, which were suitable for flip chip type semiconductor devices.

As described above, according to the wiring substrate of the present invention, it is possible to reduce the manufacturing cost by using a common standardized core substrate. Since the fine metallic wires are arranged in the core substrate, the radiating property of the wiring substrate can be enhanced.

When the filled vias, which are not connected with the wiring pattern, are connected with the grounding terminals, it is possible to reduce the occurrence of cross talk, and the electrical characteristics can be improved.

What is claimed is:

1. A wiring substrate comprising:

a core substrate;

penetrating filled vias formed in the core substrate, the diameters of the penetrating filled vias being the same and not more than 300 $\mu$m, the penetrating filled vias being formed into a matrix-shaped at regular intervals of not more than 2 mm;

a plane pattern formed on a surface of the core substrate through an insulating layer, the plane pattern having pad portions; and connecting vias penetrating the insulating layer and electrically connecting each pad portion of the plane pattern with certain, but not all, filled vias;

wherein, said core substrate is composed of a wiring body used for manufacturing a substrate in which a large number of fine metallic wires, constituting said filled vias, are embedded in parallel with the axis of a columnar body which is made in such a manner that a porous fired inorganic insulating material is impregnated with organic insulating material, and the wiring body used for manufacturing a substrate is sliced in a direction perpendicular to the axis; and said inorganic insulating material being a mixed fired body in which glass having softening point of not higher than 1000 ° C. is mixed with one or more of aluminum oxide, mullite, cordierite, silicon oxide, aluminum nitride, silicon carbide, and silicon nitride.

2. A wiring substrate according to claim 1, wherein the filled vias not connected with the plane pattern are connected with ground terminals.

3. A wiring substrate according to claim 1, wherein a ratio of the inorganic insulating material is not lower than 50 volume % and not higher than 80 volume %.

4. A wiring substrate according to claim 1, wherein the inorganic insulating material is made of a fired body of aluminum oxide, mullite, cordierite or aluminum nitride.

5. A wiring substrate according to claim 1, wherein the organic insulating material is a resin of one of polyimide, benzocyclobutene, bismaleimide triazine, epoxy and polyphenylene ether.

6. A wiring substrate comprising:

a core substrate;

penetrating filled vias formed in the core substrate, the diameters of the penetrating filled vias being the same and not more than 300 μm, the penetrating filled vias being formed into a matrix shape at regular intervals of not more than 2 mm;

a plane pattern formed on a surface of the core substrate through an insulating layer, the plane pattern having pad portions; and connecting vias penetrating the insulating layer and electrically connecting each pad portion of the plane pattern with certain, but not all, filled vias;

wherein said core substrate is composed of a wiring body used for manufacturing a substrate in which a large number of fine metallic wires are embedded in a columnar body composed of an organic insulating material of continuous phase and an inorganic insulating material of discontinuous phase, in a direction parallel with the axis of the columnar body.

7. A wiring substrate according to claim 6, wherein a ratio of the organic insulating material is not lower than 30 volume % and not higher than 60 volume %.

8. A wiring substrate according to claim 6, wherein the inorganic insulating material is one or more of aluminum oxide, mullite, cordierite, silicon oxide, aluminum nitride, silicon carbide and silicon nitride.

9. A wiring substrate according to claim 6, wherein the organic insulating material is a resin of polyimide, benzocyclobutene, bismaleimide triazine, epoxy or polyphenylene ether.

10. A wiring substrate according to claim 6, wherein the filled vias not connected with the plane pattern are connected with ground terminals.

* * * * *

UNITED STATES PATENT AND TRADEMARK OFFICE
CERTIFICATE OF CORRECTION

PATENT NO. : 6,093,476
DATED : July 25, 2000
INVENTOR(S) : Michio Horiuchi et al.

It is certified that error appears in the above-identified patent and that said Letters Patent is hereby corrected as shown below:

Column 16,
Line 28, change "matrix-shaped" to -- matrix-shape --.

Signed and Sealed this

Tenth Day of May, 2005

JON W. DUDAS
*Director of the United States Patent and Trademark Office*